(12) United States Patent
Kato et al.

(10) Patent No.: US 8,644,048 B2
(45) Date of Patent: Feb. 4, 2014

(54) SEMICONDUCTOR DEVICE

(75) Inventors: Kiyoshi Kato, Kanagawa (JP);
Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 226 days.

(21) Appl. No.: 13/230,157

(22) Filed: Sep. 12, 2011

(65) Prior Publication Data

US 2012/0063207 A1    Mar. 15, 2012

(30) Foreign Application Priority Data

Sep. 13, 2010   (JP) ................. 2010-204408

(51) Int. Cl.
*G11C 5/06* (2006.01)
(52) U.S. Cl.
USPC ............. 365/63; 365/149; 365/51; 365/72; 257/43; 257/306; 257/775
(58) Field of Classification Search
USPC ........... 365/63, 149, 51, 72; 257/43, 306, 775
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center (with English translation).

(Continued)

*Primary Examiner* — Toan Le
(74) *Attorney, Agent, or Firm* — Fish & Richardson P.C.

(57) ABSTRACT

An object of one embodiment of the present invention is to miniaturize a semiconductor device. Another object of one embodiment of the present invention is to reduce the area of a driver circuit of a semiconductor device including a memory element. A plurality of cells in which the positions of input terminals and output terminals are fixed is arranged in a first direction, wirings each of which is electrically connected to the input terminal or the output terminal of each cell are stacked over the plurality of cells, and the wirings extend in the same direction as the first direction in which the cells are arranged; thus, a semiconductor device in which a driver circuit is miniaturized is provided.

20 Claims, 4 Drawing Sheets

(56) References Cited

U.S. PATENT DOCUMENTS

| | | | |
|---|---|---|---|
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,928,580 B2 | 4/2011 | Saito | |
| 2001/0046027 A1 | 11/2001 | Tai et al. | |
| 2002/0001215 A1* | 1/2002 | Fujisawa et al. | 365/51 |
| 2002/0056838 A1 | 5/2002 | Ogawa | |
| 2002/0060931 A1* | 5/2002 | Nagai et al. | 365/189.12 |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0036706 A1* | 2/2004 | Endou | 345/690 |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0013635 A1* | 1/2007 | Ito et al. | 345/98 |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2007/0297257 A1* | 12/2007 | Sekiguchi et al. | 365/214 |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Covan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0170328 A1 | 7/2011 | Saito | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-324299 A | 12/2007 |
| WO | 2004/114391 A1 | 12/2004 |

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

(56) References Cited

OTHER PUBLICATIONS

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on their way to business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

(56) References Cited

OTHER PUBLICATIONS

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol, 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

SEMICONDUCTOR DEVICE

BACKGROUND OF THE INVENTION

1. Field of the Invention

The present invention relates to a semiconductor device using a semiconductor element.

2. Description of the Related Art

Memory devices using semiconductor elements are broadly classified into two categories: a volatile device that loses stored data when power supply stops, and a non-volatile device that retains stored data even when power is not supplied.

A typical example of a volatile memory device is a dynamic random access memory (DRAM). A DRAM stores data in such a manner that a transistor included in a memory element is selected and electric charge is accumulated in a capacitor.

Another example of a volatile memory device is a static random access memory (SRAM). An SRAM remains stored data with a circuit such as a flip-flop.

A typical example of a non-volatile memory device is a flash memory. A flash memory includes a floating gate between a gate electrode and a channel formation region in a transistor and stores data by holding charge in the floating gate.

Such a memory device using a semiconductor element includes a memory cell array including a plurality of memory cells and a driver circuit arranged in the periphery of the memory cell array as main components, and the size of the semiconductor device is limited by the area of the driver circuit. That is to say, even when only the area of a memory cell is reduced, a semiconductor device cannot be wholly miniaturized unless the area of the driver circuit can be reduced. Therefore, it is important to reduce the area of a driver circuit in miniaturizing a semiconductor device.

For example, in a semiconductor device disclosed in Patent Document 1, adjacent wiring regions in which wirings connecting a memory cell array portion and a peripheral circuit portion are formed have the same layout.

REFERENCE

[Patent Document 1] Japanese Published Patent Application No. 2007-324299

SUMMARY OF THE INVENTION

In view of the above problem, an object of one embodiment of the disclosed invention is to miniaturize a semiconductor device.

Another object of one embodiment of the disclosed invention is to reduce the area of a driver circuit of a semiconductor device including a memory element.

In the disclosed invention, a plurality of basic cells (hereinafter, referred to as cells) in which the positions of input terminals and output terminals are fixed is arranged in a first direction, wirings each of which is electrically connected to the input terminal or the output terminal of each cell are stacked over the plurality of cells, and the wirings extend in the same direction as the first direction in which the cells are arranged, whereby the driver circuit can be miniaturized. Specifically, the following structure can be employed, for example.

According to one embodiment of the present invention, a semiconductor device includes a driver circuit including n (n is an integer greater than or equal to 2) cells arranged in the first direction; n input signal lines electrically connected to input terminals provided in the respective cells; and n output signal lines electrically connected to output terminals provided in the respective cells. The n input signal lines and the n output signal lines extend in the first direction. The total number of the input signal lines and the output signal lines which are provided over one of the cells is (n−1).

According to another embodiment of the present invention, a semiconductor device includes a driver circuit including n (n is an integer greater than or equal to 2) cells arranged in the first direction; n input signal lines electrically connected to input terminals provided in the respective cells; and n output signal lines electrically connected to output terminals provided in the respective cells. The n input signal lines and the n output signal lines extend in the first direction. At least the (n−1) input signal lines and at least the (n−1) output signal lines include a bending region. The total number of the input signal lines and the output signal lines which are provided over one of the cells is (n−1).

In the above semiconductor device, in one of the cells, the total number of intersections of a straight line connecting the input terminal and the output terminal, and the input signal line or the output signal line provided over the cell may be (n−1).

The above semiconductor device may further include a memory cell array, and input terminals included in the memory cell array and n output signal lines may be electrically connected to one another.

In the above semiconductor device, the first direction may be a row direction of the memory cell array.

In the above semiconductor device, the first direction may be a column direction of the memory cell array.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" or "wirings", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

According to one embodiment of the present invention, a miniaturized semiconductor device can be provided.

According to one embodiment of the present invention, a semiconductor device including a memory element and a circuit for driving the memory element whose area is reduced can be provided.

DETAILED DESCRIPTION OF THE INVENTION

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiment.

Note that the position, the size, the range, or the like of each structure illustrated in the drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and do not limit the number, the arrangement, and the order of the steps unless otherwise specified.

Embodiment 1

In this embodiment, a structure of a semiconductor device according to one embodiment of the disclosed invention will be described with reference to drawings.

Figure 1:
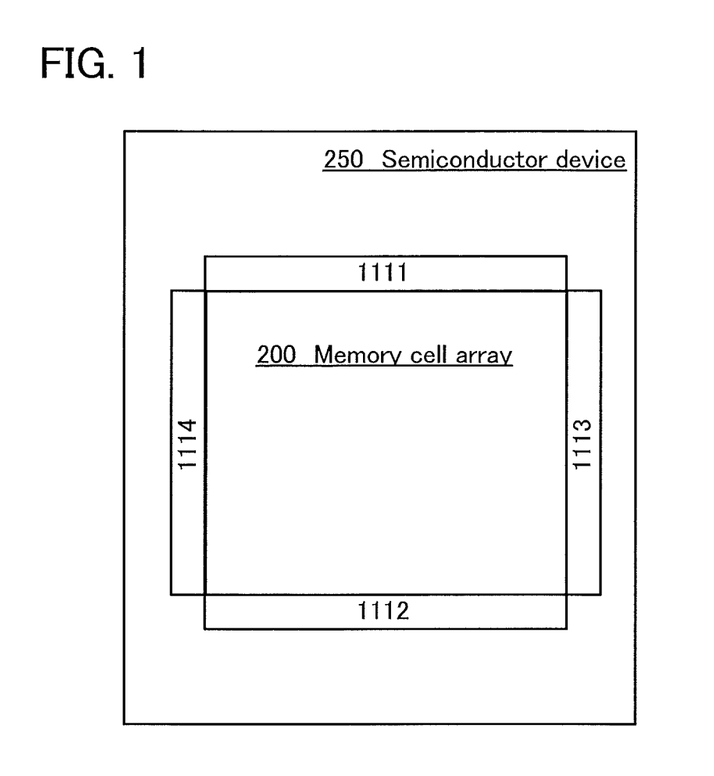
FIG. 1 is a schematic diagram of a semiconductor device.

FIG. 1 illustrates a structure of a semiconductor device according to one embodiment of the present invention. A semiconductor device 250 described in this embodiment includes a memory cell array 200 including a plurality of memory cells and a first driver circuit portion 1111, a second driver circuit portion 1112, a third driver circuit portion 1113, and a fourth driver circuit portion 1114 which drive the memory cell array 200. Note that the number of driver circuit portions is not limited to the structure in FIG. 1.

A non-volatile memory or a volatile memory can be applied to the memory cell array 200. When the memory cell array 200 includes a transistor having a floating gate, a non-volatile memory can be obtained. Note that as a non-volatile memory, either a NOR-type non-volatile memory or a NAND-type non-volatile memory can be used.

Alternatively, the memory cell array 200 may have a circuit structure of a DRAM, an SRAM, or a ferroelectric memory.

The memory cell array 200 can include a transistor using a semiconductor whose band gap is wider than that of a silicon semiconductor in addition to a transistor including a silicon semiconductor. The off-state current of the transistor can be lower with the use of a semiconductor having a wide band gap, so that a memory with a novel structure can be realized. Silicon carbide (SiC), gallium nitride (GaN), or the like is known as a semiconductor with a wider band gap than a silicon semiconductor, but a device including such a semiconductor cannot be manufactured with high productivity because process temperatures of them are higher than that of a silicon semiconductor. In contrast, as an oxide semiconductor (preferably a metal oxide semiconductor), a semiconductor whose band gap of 2.5 eV or more, preferably 3 eV or more can easily formed by a sputtering method, a printing method, or the like, and the process temperature is low, which are advantageous.

Figure 2:
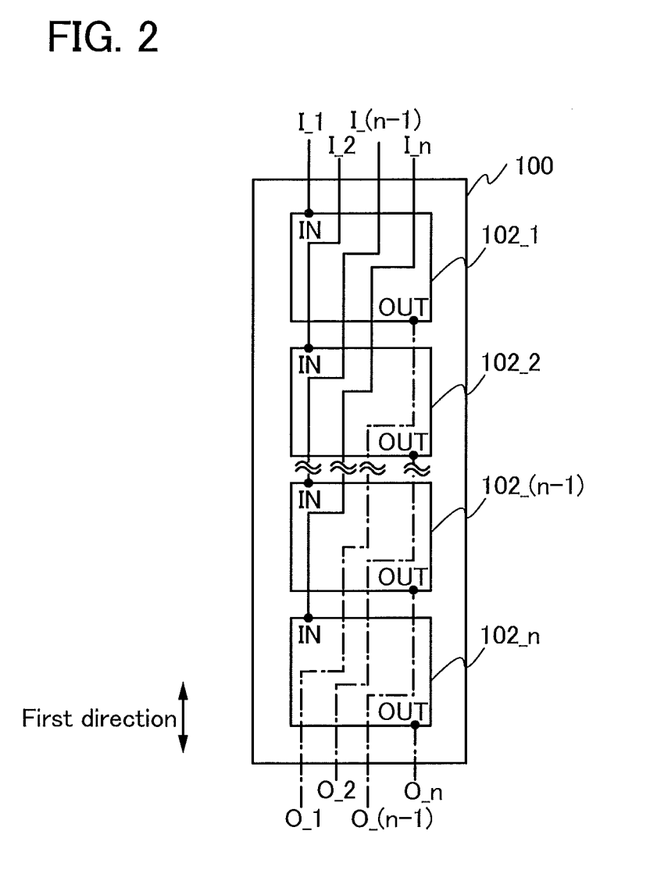
FIG. 2 is a schematic diagram of a semiconductor device.

In addition, at least one of the first driver circuit portion 1111 to the fourth driver circuit portion 1114 illustrated in FIG. 1 includes a driver circuit 100 illustrated in FIG. 2. In this embodiment, the driver circuit 100 includes at least n (n is an integer greater than or equal to 2) cells 102 arranged in a first direction (a direction indicated by an arrow in FIG. 2), n input signal lines (I) electrically connected to respective input terminals (IN) provided in the cells 102, and n output signal lines (O) electrically connected to respective output terminals (OUT) provided in the cells 102.

The cell 102 is an electric circuit element which is used in logic synthesis and in placement and routing, and has a predetermined basic function of an electric circuit. Specifically, for example, a cell or the like having a function in which an output signal is determined when an input signal is determined by an operation such as NOT, OR, AND, NOR, NAND, XOR, or XNOR can be used. Alternatively, a cell having a function of obtaining output in accordance with history of an input signal, such as a flip-flop (FF) or a latch (LAT), may be used. Further alternatively, a level shifter or a multiplexer may be used.

In the n cells 102 illustrated in FIG. 2, the positions of the input terminals (IN) and the output terminals (OUT) are fixed. Note that the first direction is preferably a column direction or a row direction of the memory cell array 200 in FIG. 1.

Note that in FIG. 2, the input signal lines (I) connected to the input terminals (IN) of the cells 102 are represented by solid lines and the output signal lines (O) connected to the output terminals (OUT) of the cells 102 are represented by dashed-dotted lines. In addition, wirings having a similar function are distinguished by "_1", "_2", "_n", and the like added to the end of their names.

The input signal lines (I) and the output signal lines (O) extend in the first direction in which the cells 102 are arranged and are provided so as to overlap with the cells 102 (including semiconductor elements such as transistors included in the cells 102) with an insulating layer provided therebetween. When the input signal lines and the output signal lines are stacked over the cells 102, the area of the driver circuit can be reduced; therefore, the semiconductor device can be miniaturized.

The first input signal line (I_1) of the n input signal lines (I) is connected to the input terminal of the first cell 102_1, and the second input signal line (I_2) of the n input signal lines (I) is connected to the input terminal of the second cell 102_2. Following is in a similar manner, and the (n−1)-th input signal line (I_(n−1)) is connected to the input terminal of the (n−1)-th cell 102_(n−1), and the n-th input signal line (I_n) is connected to the input terminal of the n-th cell 102_n.

In the output signal lines (O) as well, the first output signal line (O_1) of the n output signal lines is connected to the output terminal of the first cell 102_1, and the second output signal line (O_2) of the n output signal lines is connected to the output terminal of the second cell 102_2. The (n−1)-th output signal line (O_(n−1)) is connected to the output terminal of the (n−1)-th cell 102_(n−1), and the n-th output signal line (O_n) is connected to the output terminal of the n-th cell 102_n.

Further, in each of the cells 102, the input terminal and the output terminal are connected to each other using the same wiring layer as a semiconductor element of a transistor and the like included in the cell 102. For example, a gate wiring of the transistor included in the cell 102 and a wiring which connects the input terminal and the output terminal of the cell 102 may be formed in the same steps. Alternatively, a source wiring (or a drain wiring) of the transistor included in the cell 102 and the wiring which connects the input terminal and the output terminal of the cell 102 may be formed in the same steps.

Over the cell 102_1, the (n−1) input signal lines which are connected to the respective cells 102_2 to 102_n are arranged. Over the cell 102_n, the (n−1) output signal lines which are connected to the respective cells 102_1 to 102_(n−1) are arranged. Over the cell 102_k (k is an integer greater than or equal to 2 and less than or equal to (n−1)), the input signal lines (I) which are connected to the respective cells 102_(k+1) to 102_n and the output signal lines (O) which are connected to the respective cells 102_1 to 102_(k−1) are arranged. Thus, over the cell 102_k, by the value of {n−(k+1)+1}+(k−1), the (n−1) input signal lines (I) and the output signal lines (O) in total are arranged.

Since the positions of the input terminals and the output terminals are fixed in the cells 102, the (n−1) input signal lines other than the first input signal line and the (n−1) output signal lines other than the n-th output signal line include bending regions. The (n−1) input signal lines or the (n−1) output signal lines each including a bending region; therefore, signal lines can be provided over the cells 102 without intersecting with each other. Note that a bending region in one input signal line or one output signal line is not necessarily one. Although the input signal line or the output signal line is bended in a direction perpendicular to the first direction in FIG. 2, an embodiment of the present invention is not limited thereto. However, the (n−1) input signal lines or the (n−1) output signal lines are preferably bended in one direction. In addition, a bending region can be provided in the first input signal line or the n-th output signal line.

In addition, the total number of intersections of a straight line connecting the input terminal and the output terminal of the cell 102 (including a straight line overlapping with the straight line in a direction perpendicular to the paper) and the input signal line or the output signal line provided over the cell 102 is (n−1). It can also be said that the (n−1) input signal lines and output signal lines provided over the cells 102 are each arranged in a region between the input terminal and the output terminal. As described above, the positions of the input terminals and the output terminals in the cells 102 are fixed, and in order to improve the degree of freedom of wiring layout of the input/output signal lines, it is preferable that a region between them be wide. For example, the input terminal and the output terminal are preferably provided on a diagonal line of the cell.

As described above, a plurality of cells in which the positions of input terminals and output terminals are fixed is arranged in a first direction, wirings each of which is electrically connected to the input terminal or the output terminal of each cell are stacked over the plurality of cells, and the wirings extend in the same direction as the first direction in which the cells are arranged, whereby a driver circuit can be miniaturized. Further, a semiconductor device including the driver circuit can be miniaturized.

Note that the circuit layout and the like for the semiconductor device of an embodiment of the disclosed invention are not limited to those described above and can be changed as appropriate in accordance with an embodiment as long as the semiconductor device can operate.

The structures, methods, and the like described in this embodiment can be combined as appropriate with any of the structures, methods, and the like and described in the other embodiments.

Embodiment 2

In this embodiment, an example of a memory cell applicable to the semiconductor device described in Embodiment 1 will be described with reference to drawings.

Figure 3A:
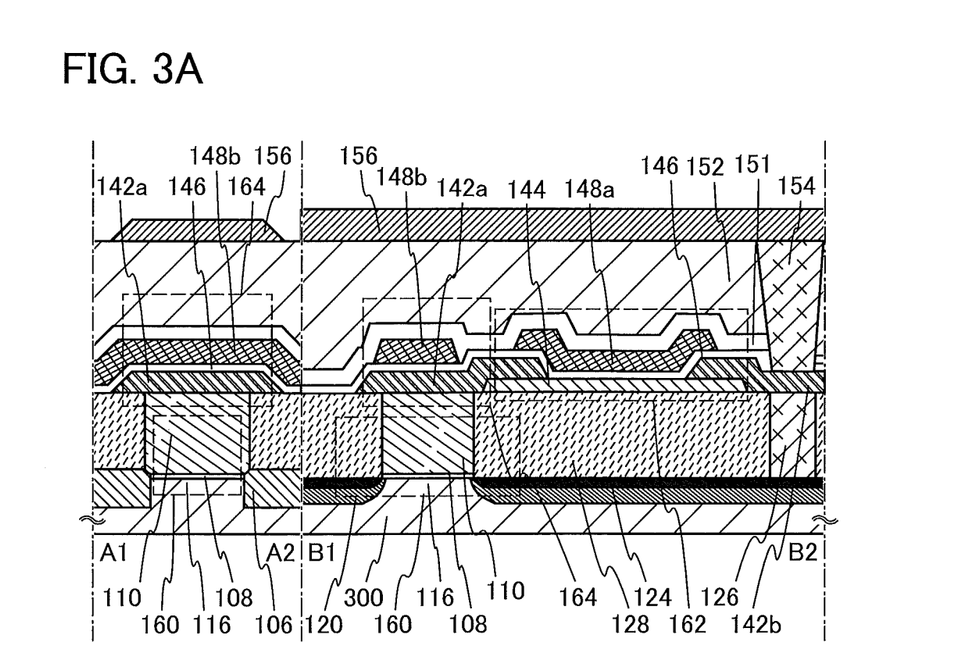
FIGS. 3A to 3C are a cross-sectional view, a plan view, and a circuit diagram illustrating an example of a semiconductor device.
Figure 3B:
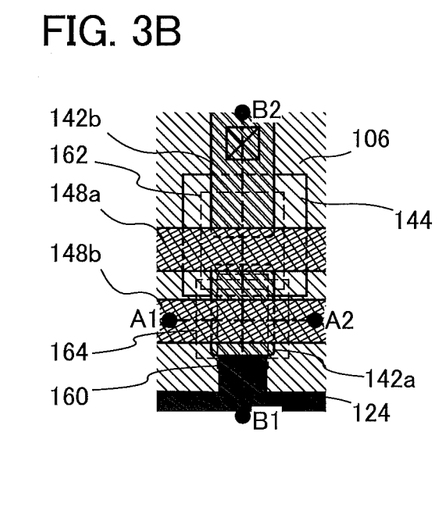
Figure 3C:
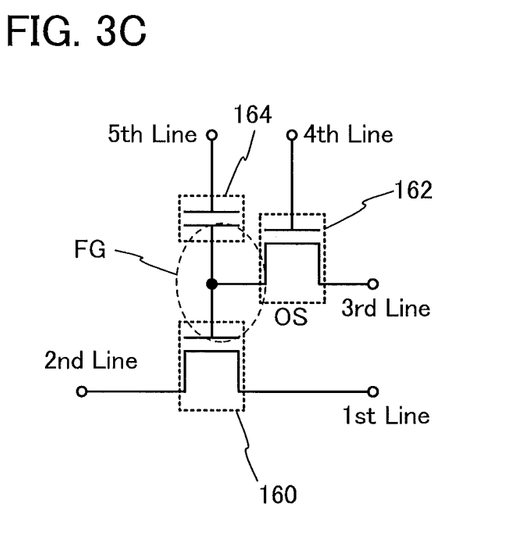

FIGS. 3A to 3C illustrate an example of a structure of a semiconductor device. FIG. 3A illustrates a cross section of the semiconductor device, and FIG. 3B illustrates a plan view of the semiconductor device. Here, FIG. 3A illustrates a cross section taken along line A1-A2 and line B1-B2 in FIG. 3B. In addition, FIG. 3C illustrates an example of a diagram of a circuit using the semiconductor device as a memory element. The semiconductor device illustrated in FIGS. 3A and 3B includes a transistor 160 including a first semiconductor material in a lower portion, and a transistor 162 including a second semiconductor material in an upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, gallium arsenide, or the like can be used, and a single crystal semiconductor is preferably used. A transistor including such a semiconductor material can operate at high speed easily. On the other hand, a transistor including an oxide semiconductor can hold charge for a long time owing to its characteristics.

Note that in the transistor 162, it is preferable that the oxide semiconductor layer 144 be highly purified by sufficiently removing impurities such as hydrogen or sufficiently supplying oxygen. Specifically, the hydrogen concentration in the oxide semiconductor layer 144 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration in the oxide semiconductor layer 144 is measured by secondary ion mass spectrometry (SIMS). In the oxide semiconductor layer 144 which is highly purified by sufficiently reducing the concentration of hydrogen therein and in which defect levels in an energy gap due to oxygen deficiency are reduced by supplying a sufficient amount of oxygen, the carrier concentration is lower than $1 \times 10^{12}$/cm$^3$, preferably lower than $1 \times 10^{11}$/cm$^3$, more preferably lower than $1.45 \times 10^{10}$/cm$^3$. For example, the off-state current (here, current per micrometer (μm) of channel width) at room temperature (25° C.) is lower than or equal to 100 zA (1 zA (zeptoampere) is $1 \times 10^{-21}$ A), preferably lower than or equal to 10 zA. In this manner, by using an oxide semiconductor which is made to be an i-type (intrinsic) oxide semiconductor or a substantially i-type oxide semiconductor, the transistor 162 which has extremely favorable off-state current characteristics can be obtained.

Further, the oxide semiconductor layer 144 from which impurities, e.g., an alkali metal and an alkaline earth metal, are reduced is preferable. For example, the sodium concentration in the oxide semiconductor layer 144 is $5 \times 10^{16}$ cm$^{-3}$ or lower, preferably $1 \times 10^{16}$ cm$^{-3}$ or lower, more preferably $1 \times 10^{15}$ cm$^{-3}$ or lower. The lithium concentration in the oxide semiconductor layer 144 is $5 \times 10^{15}$ cm$^{-3}$ or lower, preferably $1 \times 10^{15}$ cm$^{-3}$ or lower, and the potassium concentration in the oxide semiconductor layer 144 is $5 \times 10^{15}$ cm$^{-3}$ or lower, preferably $1\times10^{15}$ cm$^{-3}$ or lower. Note that the sodium concentration, the lithium concentration, and the potassium concentration in the above oxide semiconductor layer 144 are measured by secondary ion mass spectrometry (SIMS).

It has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. An alkali metal is not an element included in an oxide semiconductor, and therefore, is an impurity. Also, an alkaline earth metal is an impurity in the case where an alkaline earth metal is not included in an oxide semiconductor. When an insulating film in contact with the oxide semiconductor film is an oxide, an alkali metal, in particular, Na diffuses into the insulating film and becomes Na$^+$. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor film is $5\times10^{19}$ cm$^{-3}$ or lower, especially $5\times10^{18}$ cm$^{-3}$ or lower, the concentration of the alkali metal is preferably reduced.

In addition, the oxide semiconductor is preferably a semiconductor in which the Fermi level ($E_f$) and the intrinsic Fermi level ($E_i$) are equivalent ($E_f=E_i$) or the intrinsic Fermi level ($E_i$) is higher than the Fermi level ($E_f$) ($E_f<E_i$), that is, a so-called p$^-$-type semiconductor. For example, tin is added to an oxide semiconductor as a dopant, whereby a p$^-$-type oxide semiconductor can be obtained. Note that when an oxide semiconductor is i-type (intrinsic) or substantially i-type, the Fermi level ($E_f$) is more easily controlled by adding an impurity, which is preferable. Further, for a gate electrode, a material having a high work function ($\phi_M$) is preferably used. With the above structure, the transistor can be normally off and it is effective that a reverse bias is applied to the transistor. Thus, a transistor with small off-state current which is, for example, less than or equal to 1 yA at 85° C. and less than or equal to 0.1 yA at room temperature, can be obtained; by using the transistor as a memory element, a semiconductor device with improved data holding characteristics (memory retention) can be obtained.

The transistor 160 in FIGS. 3A to 3C includes a channel formation region 116 provided in a substrate 300 including a semiconductor material (such as silicon), impurity regions 120 provided so that the channel formation region 116 is sandwiched therebetween, metal compound regions 124 in contact with the impurity regions 120, a gate insulating layer 108 provided over the channel formation region 116, and a gate electrode 110 provided over the gate insulating layer 108.

As the substrate 300 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer provided therebetween.

An electrode 126 is connected to part of the metal compound region 124 of the transistor 160. Here, the electrode 126 functions as a source electrode or a drain electrode of the transistor 160. Further, an element isolation insulating layer 106 is provided over the substrate 300 so as to surround the transistor 160, and an insulating layer 128 is provided so as to cover the transistor 160. Note that it is preferable that the transistor 160 do not have a sidewall insulating layer as illustrated in FIGS. 3A to 3C to realize high integration. On the other hand, when importance is put on the characteristics of the transistor 160, sidewall insulating layers may be provided on side surfaces of the gate electrode 110, and the impurity regions 120 may include a region with a different impurity concentration.

The transistor 160 can be formed by a known technique. As the semiconductor material other than an oxide semiconductor, for example, silicon, germanium, silicon germanium, silicon carbide, gallium arsenide, or the like is used, whereby the transistor 160 can operate at high speed. Thus, when the transistor is used as a reading transistor, data can be read at high speed. In addition, a transistor provided in a cell of a driver circuit can be manufactured through the same manufacturing process as the transistor 160.

After the transistor 160 is formed, as treatment prior to the formation of the transistor 162 and a capacitor 164, the insulating layer 128 is subjected to CMP treatment so that an upper surface of the gate electrode 110 is exposed. As treatment for exposing the upper surface of the gate electrode 110, etching treatment or the like can also be employed instead of CMP treatment, but in order to improve characteristics of the transistor 162, the surface of the insulating layer 128 is preferably made as flat as possible.

Next, an oxide semiconductor layer is formed over the insulating layer 128, and is selectively etched to form the oxide semiconductor layer 144. As a material used for the oxide semiconductor layer, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like can be used. In addition, the above materials may contain SiO$_2$. Here, for example, an In—Ga—Zn—O-based material means an oxide film containing indium (In), gallium (Ga), and zinc (Zn), and there is no particular limitation on the composition ratio. Further, the In—Ga—Zn—O-based oxide semiconductor material may contain an element other than In, Ga, and Zn.

As the oxide semiconductor layer, a thin film including a material expressed by the chemical formula, InMO$_3$(ZnO)$_m$ (m>0) can be used. Here, M represents one or more metal elements selected from Ga, Al, Mn, and Co. For example, M may be Ga, Ga and Al, Ga and Mn, Ga and Co, or the like.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The thickness of the oxide semiconductor layer is preferably greater than or equal to 3 nm and less than or equal to 30 nm. This is because the transistor might be normally on when the oxide semiconductor layer is too thick (e.g., when the thickness is greater than or equal to 50 nm).

The oxide semiconductor layer is preferably formed by a method in which impurities such as hydrogen, water, a hydroxyl group, or hydride do not easily enter the oxide semiconductor layer. For example, a sputtering method can be used.

After that, heat treatment (first heat treatment) is preferably performed on the oxide semiconductor layer. By the first heat treatment, excessive hydrogen (including water and a hydroxyl group) in the oxide semiconductor layer can be removed. The temperature of the first heat treatment is, for example, higher than or equal to 300° C. and lower than 550° C., preferably higher than or equal to 400° C. and lower than or equal to 500° C.

The first heat treatment can be performed in such a way that, for example, an object to be heated is introduced into an electric furnace in which a resistance heating element or the like is used and heated at 450° C. for one hour under a nitrogen atmosphere. The oxide semiconductor layer is not exposed to the air during the heat treatment so that entry of water or hydrogen can be prevented.

Next, a conductive layer is formed over the gate electrode 110 which is exposed, the insulating layer 128, the oxide semiconductor layer 144, and the like, and etched selectively, so that a source electrode 142a and a drain electrode 142b are formed.

The conductive layer can be formed by a PVD method such as a sputtering method, or a CVD method such as a plasma CVD method. Further, as the material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may be used.

The conductive layer can have a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source electrode 142a and the drain electrode 142b having tapered shapes.

The channel length (L) of the upper transistor 162 is determined by a distance between a lower edge portion of the source electrode 142a and a lower edge portion of the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers.

Then, a gate insulating layer 146 which covers the source electrode 142a and the drain electrode 142b and which is in contact with the oxide semiconductor layer 144 is formed.

Next, over the gate insulating layer 146, a gate electrode 148a is formed in a region overlapping with the oxide semiconductor layer 144 and an electrode 148b is formed in a region overlapping with the source electrode 142a.

After the gate insulating layer 146 is formed, second heat treatment is preferably performed under an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour under a nitrogen atmosphere. By performing the second heat treatment, variation in electrical characteristics of the transistor can be reduced. Further, when the gate insulating layer 146 contains oxygen and is in contact with the oxide semiconductor layer 144 while being heated, whereby the gate insulating layer 146 can supply oxygen, which is one of the main components of the oxide semiconductor and might be reduced through the above dehydration (or dehydrogenation) treatment, to the oxide semiconductor layer 144 to fill oxygen vacancies in the oxide semiconductor layer 144; thus, an i-type (intrinsic) or substantially i-type oxide semiconductor layer can be formed.

Note that the timing of the second heat treatment is not particularly limited to this. For example, the second heat treatment may be performed after the gate electrode is formed.

As described above, the first heat treatment and the second heat treatment are performed, so that the oxide semiconductor layer 144 can be highly purified so as to contain impurities which are not main components as little as possible.

The gate electrode 148a and the electrode 148b can be formed in such a manner that a conductive layer is formed over the gate insulating layer 146 and then etched selectively.

Then, an insulating layer 151 and an insulating layer 152 are formed over the gate insulating layer 146, the gate electrode 148a, and the electrode 148b. The insulating layer 151 and the insulating layer 152 can be formed by a sputtering method, a CVD method, or the like. The insulating layer 151 and the insulating layer 152 can be formed using a material including an inorganic insulating material such as silicon oxide, silicon oxynitride, silicon nitride, hafnium oxide, or aluminum oxide.

Next, an opening that reaches the drain electrode 142b is formed in the gate insulating layer 146, the insulating layer 151, and the insulating layer 152. The opening is formed by selective etching with the use of a mask or the like.

After that, an electrode 154 is formed in the opening, and a wiring 156 in contact with the electrode 154 is formed over the insulating layer 152.

The electrode 154 can be formed in such a manner that, for example, a conductive layer is formed by a PVD method, a CVD method, or the like in a region including the opening and then part of the conductive layer is removed by etching treatment, CMP, or the like.

The wiring 156 is formed in such a manner that a conductive layer is formed by a PVD method such as a sputtering method or a CVD method such as a plasma CVD method and then the conductive layer is patterned. Further, as the material of the conductive layer, an element selected from Al, Cr, Cu, Ta, Ti, Mo, and W, an alloy including any of the above elements as its component, or the like can be used. Any of Mn, Mg, Zr, Be, Nd, and Sc, or a material including any of these in combination may be used. The details are the similar to those of the source or drain electrode or the like.

Through the above process, the transistor 162 including the highly purified oxide semiconductor layer 144 and the capacitor 164 are completed. The capacitor 164 includes the source electrode 142a, the oxide semiconductor layer 144, the gate insulating layer 146, and the electrode 148b.

FIG. 3C illustrates an example of a diagram of a circuit using the semiconductor device as a memory element. In FIG. 3C, one of a source electrode and a drain electrode of the transistor 162, one electrode of the capacitor 164, and a gate electrode of the transistor 160 are electrically connected to one another. A first wiring (a 1st line, also referred to as a source line) is electrically connected to a source electrode of the transistor 160. A second wiring (a 2nd line, also referred to as a bit line) is electrically connected to a drain electrode of the transistor 160. A third wiring (a 3rd line, also referred to as a first signal line) is electrically connected to the other of the source electrode and the drain electrode of the transistor 162. A fourth wiring (a 4th line, also referred to as a second signal line) is electrically connected to a gate electrode of the transistor 162. A fifth wiring (a 5th line, also referred to as a word line) is electrically connected to the other electrode of the capacitor 164.

The transistor 162 including an oxide semiconductor has extremely low off-state current; therefore, when the transistor 162 is in an off state, the potential of a node (hereinafter, a node FG) where the one of the source electrode and the drain electrode of the transistor 162, the one electrode of the capacitor 164, and the gate electrode of the transistor 160 are electrically connected to one another can be held for an extremely long time. The capacitor 164 facilitates holding of charge given to the node FG and reading of the held data.

When data is stored in the semiconductor device (in writing of data), first, the potential of the fourth wiring is set to a potential at which the transistor 162 is turned on, whereby the transistor 162 is turned on. Thus, the potential of the third wiring is applied to the node FG and a predetermined amount of charge is accumulated in the node FG. Here, charge for applying either of two different potential levels (hereinafter referred to as a low-level charge and a high-level charge) is given to the node FG. After that, the potential of the fourth wiring is set to a potential at which the transistor 162 is turned off, whereby the transistor 162 is turned off. This makes the node FG floating and the predetermined amount of charge is held in the node FG. The predetermined amount of charge is thus accumulated and held in the node FG, whereby the memory cell can store data.

Since the off-state current of the transistor 162 is extremely small, the charge accumulated in the node FG is held for a long period. This can remove the need of refresh operation or drastically reduce the frequency of the refresh operation, which leads to a sufficient reduction in power consumption. Moreover, stored data can be stored for a long time even when power is not supplied.

When stored data is read out (in reading of data), while a predetermined potential (a fixed potential) is applied to the first wiring, an appropriate potential (a read-out potential) is applied to the fifth wiring, whereby the transistor 160 changes its state depending on the amount of charge held in the node FG. This is because in general, when the transistor 160 is an n-channel transistor, an apparent threshold value $V_{th\_H}$ of the transistor 160 in the case where a high-level charge is held in the node FG is lower than an apparent threshold value $V_{th\_L}$ of the transistor 160 in the case where a low-level charge is held in the node FG. Here, an apparent threshold voltage refers to the potential of the fifth wiring, which is needed to turn on the transistor 160. Thus, by setting the potential of the fifth wiring to a potential $V_0$ which is between $V_{th\_H}$ and $V_{th\_L}$, charge held in the node FG can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. In such a manner, by controlling the potential of the fifth wiring and determining whether the transistor 160 is in an on state or off state (reading out the potential of the second wiring), stored data can be read out.

Further, in order to rewrite stored data, a new potential is applied to the node FG that is holding the predetermined amount of charge given in the above writing, so that the charge of the new data is held in the node FG. Specifically, the potential of the fourth wiring is set to a potential at which the transistor 162 is turned on, whereby the transistor 162 is turned on. Thus, the potential of the third wiring (a potential of new data) is applied to the node FG, and the predetermined amount of charge is accumulated in the node FG. After that, the potential of the fourth wiring is set to a potential at which the transistor 162 is turned off, whereby the transistor 162 is turned off. Thus, charge of the new data is held in the node FG. In other words, while the predetermined amount of charge given in the first writing is held in the node FG, the same operation (a second writing) as in the first writing is performed, whereby the stored data can be overwritten.

The off-state current of the transistor 162 described in this embodiment can be sufficiently reduced by using the oxide semiconductor layer 144 which is highly purified and is intrinsic. With the use of such a transistor, a semiconductor device in which stored data can be stored for an extremely long time can be obtained.

In the semiconductor device described in this embodiment, the transistor 160 and the transistor 162 overlap with each other; therefore, a semiconductor device whose integration degree is sufficiently improved can be realized. By a combination with the structure of the driver circuit described in Embodiment 1, the semiconductor device can be further miniaturized.

The structures, methods, and the like described in this embodiment can be combined as appropriate with any of the structures, methods, and the like and described in the other embodiments.

Embodiment 3

In this embodiment, applications of the semiconductor device described in any of the above embodiments to electronic devices are described with reference to FIGS. 4A to 4F. In this embodiment, applications of the semiconductor device to electronic devices such as a computer, a cellular phone handset (also referred to as a cellular phone or a cellular phone device), a personal digital assistant (including a portable game machine, an audio reproducing device, and the like), a camera such as a digital camera or a digital video camera, electronic paper, and a television set (also referred to as a television or a television receiver) are described.

Figure 4A:
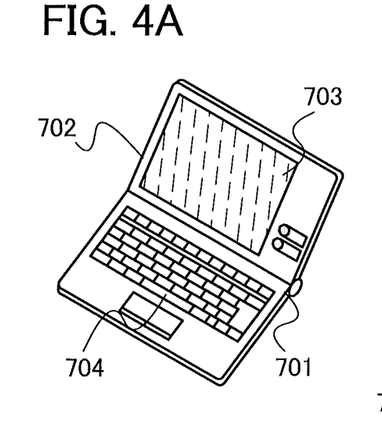
FIGS. 4A to 4F are examples of electronic devices.

FIG. 4A is a laptop personal computer, which includes a housing 701, a housing 702, a display portion 703, a keyboard 704, and the like. The semiconductor device described in any of the above embodiments is provided in at least one of the housing 701 and the housing 702. Thus, a laptop personal computer in which data is written and read at high speed, data is retained for a long time, and power consumption is sufficiently reduced can be realized.

Figure 4B:
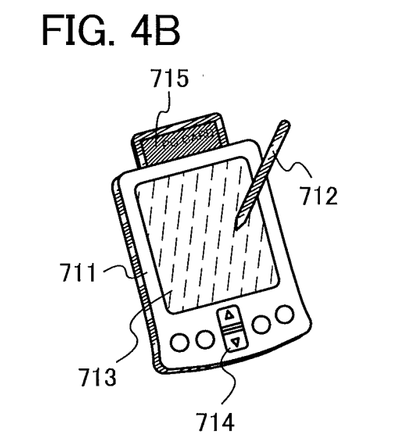

FIG. 4B is a personal digital assistant (PDA). A main body 711 is provided with a display portion 713, an external interface 715, operation buttons 714, and the like. Further, a stylus 712 or the like for operation of the personal digital assistant is provided. In the main body 711, the semiconductor device described in any of the above embodiments is provided. Thus, a personal digital assistant in which data is written and read at high speed, data is retained for a long time, and power consumption is sufficiently reduced can be realized.

Figure 4C:
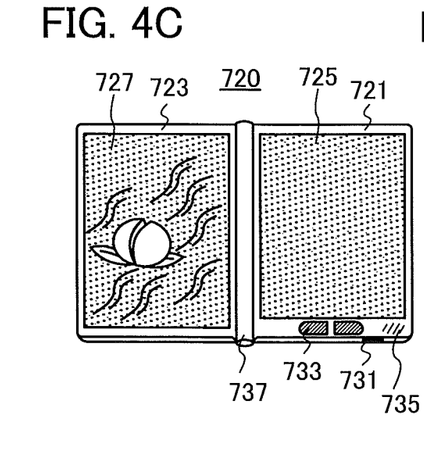

FIG. 4C is an e-book reader 720 provided with electronic paper. The e-book reader 720 has two housings 721 and 723. The housing 721 and the housing 723 include a display portion 725 and a display portion 727, respectively. The housings 721 and 723 are connected to each other by a hinge 737 and can be opened and closed with the hinge 737 used as an axis. The housing 721 is provided with a power switch 731, operation keys 733, a speaker 735, and the like. At least one of the housings 721 and 723 is provided with the semiconductor device described in any of the above embodiments. Thus, an e-book reader in which data is written and read at high speed, data is retained for a long time, and power consumption is sufficiently reduced can be realized.

Figure 4D:
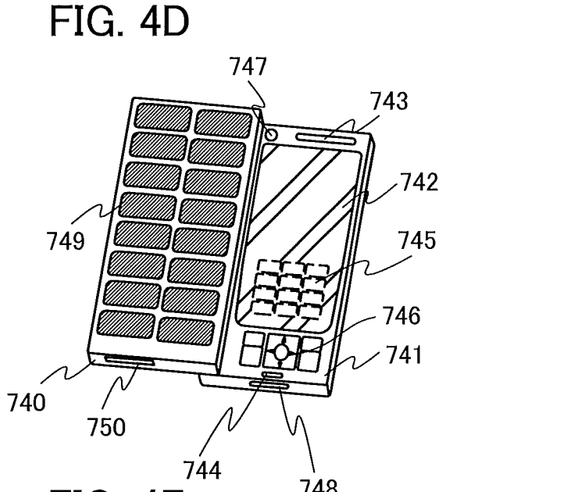

FIG. 4D is a cellular phone handset, which includes two housings 740 and 741. Further, the housing 740 and the housing 741 which are developed as illustrated in FIG. 4D can overlap with each other by sliding; thus, the size of the cellular phone handset can be decreased, which makes the cellular phone handset suitable for being carried. The housing 741 includes a display panel 742, a speaker 743, a microphone 744, operation keys 745, a pointing device 746, a camera lens 747, an external connection terminal 748, and the like. The housing 740 includes a solar cell 749 for storing electricity in the cellular phone handset, an external memory slot 750, and the like. In addition, an antenna is incorporated in the housing 741. At least one of the housings 740 and 741 is provided with the semiconductor device described in any of the above embodiments. Thus, a cellular phone handset in which data is written and read at high speed, data is retained for a long time, and power consumption is sufficiently reduced can be realized.

Figure 4E:
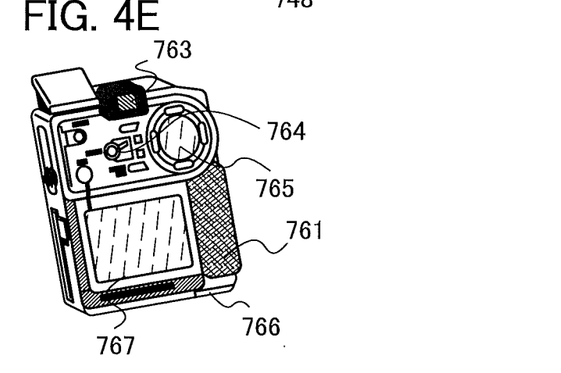

FIG. 4E is a digital camera, which includes a main body 761, a display portion 767, an eyepiece 763, an operation switch 764, a display portion 765, a battery 766, and the like. In the main body 761, the semiconductor device described in any of the above embodiments is provided. Thus, a digital camera in which data is written and read at high speed, data is retained for a long time, and power consumption is sufficiently reduced can be realized.

Figure 4F:
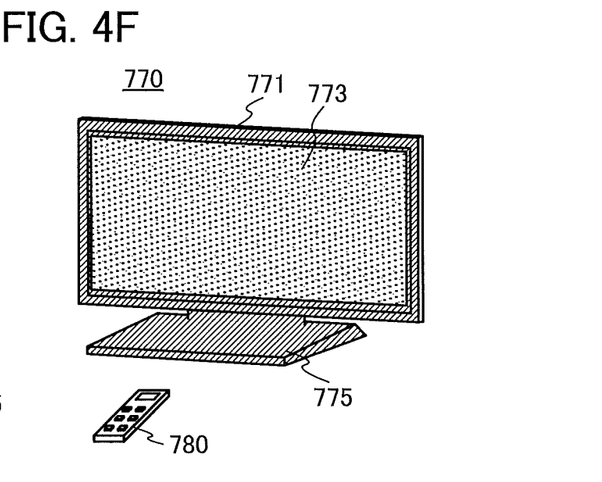

FIG. 4F is a television set 770, which includes a housing 771, a display portion 773, a stand 775, and the like. The television set 770 can be operated with an operation switch of the housing 771 or a remote control 780. The semiconductor device described in any of the above embodiments is mounted on the housing 771 and the remote control 780. Thus, a television set in which data is written and read at high speed, data is retained for a long time, and power consumption is sufficiently reduced can be realized.

As described above, the electronic devices described in this embodiment each include the semiconductor device according to any of the above embodiments. Thus, electronic devices with low power consumption can be realized.

This application is based on Japanese Patent Application serial no. 2010-204408 filed with Japan Patent Office on Sep. 13, 2010, the entire contents of which are hereby incorporated by reference.

What is claimed is:

1. A semiconductor device comprising a driver circuit, the driver circuit comprising:
   n cells arranged in a first direction, each of n cells having an input terminal and an output terminal, n being an integer greater than or equal to 2;
   n input signal lines, each corresponding to one of the n cells and connected to the input terminal of the corresponding cell; and
   n output signal lines, each corresponding to one of the n cells and connected to the output terminal of the corresponding cell,
   wherein the n input signal lines and the n output signal lines extend in the first direction, and
   wherein the total number of input signal lines and output signal lines which are provided over one of the n cells is (n−1).

2. The semiconductor device according to claim 1, wherein the total number of intersections of a straight line connecting the input terminal and the output terminal, and the input signal lines or the output signal lines provided over each of the n cells is (n−1) in one of the n cells.

3. The semiconductor device according to claim 1, wherein the n input signal lines and the n output signal lines are provided over an insulating layer provided between the n cells, and the n input signal lines and the n output signal lines.

4. A semiconductor device comprising a driver circuit, the driver circuit comprising:
   n cells arranged in a first direction, each of n cells having an input terminal and an output terminal, n being an integer greater than or equal to 2;
   n input signal lines, each corresponding to one of the n cells and connected to the input terminal of the corresponding cell; and
   n output signal lines, each corresponding to one of the n cells and connected to the output terminal of the corresponding cell,
   wherein the n input signal lines and the n output signal lines extend in the first direction,
   wherein each of the (n−1) input signal lines other than a first input signal line includes at least one bending region,
   wherein each of the (n−1) output signal lines other than n-th output signal line includes at least one bending region, and
   wherein the total number of input signal lines and output signal lines which are provided over one of the n cells is (n−1).

5. The semiconductor device according to claim 4, wherein the total number of intersections of a straight line connecting the input terminal and the output terminal, and the input signal lines or the output signal lines provided over each of the n cells is (n−1) in one of the n cells.

6. The semiconductor device according to claim 4, wherein the n input signal lines and the n output signal lines are provided over an insulating layer provided between the n cells, and the n input signal lines and the n output signal lines.

7. A semiconductor device comprising:
   a memory cell array including a plurality of memory cells; and
   a driver circuit arranged in the periphery of the memory cell array,
   wherein the driver circuit comprises:

n cells arranged in a first direction, each of n cells having an input terminal and an output terminal, n being an integer greater than or equal to 2;

n input signal lines, each corresponding to one of the n cells and connected to the input terminal of the corresponding cell; and n output signal lines, each corresponding to one of the n cells and connected to the output terminal of the corresponding cell, wherein the n input signal lines and the n output signal lines extend in the first direction, wherein the total number of input signal lines and output signal lines which are provided over one of the n cells is (n−1), and wherein input terminals included in the memory cell array and then output signal lines are electrically connected to one another.

8. The semiconductor device according to claim 7, wherein the total number of intersections of a straight line connecting the input terminal and the output terminal, and the input signal lines or the output signal lines provided over each of the n cells is (n−1) in one of the n cells.

9. The semiconductor device according to claim 7, wherein the n input signal lines and the n output signal lines are provided over an insulating layer provided between the n cells, and the n input signal lines and the n output signal lines.

10. The semiconductor device according to claim 7, wherein the first direction is a row direction of the memory cell array.

11. The semiconductor device according to claim 7, wherein the first direction is a column direction of the memory cell array.

12. The semiconductor device according to claim 7, wherein each of the memory cells comprises a first transistor, a second transistor, and a capacitor.

13. The semiconductor device according to claim 12, wherein the first transistor comprises an oxide semiconductor.

14. A semiconductor device comprising:
a memory cell array including a plurality of memory cells; and
a driver circuit arranged in the periphery of the memory cell array,
wherein the driver circuit comprises:
n cells arranged in a first direction, each of n cells having an input terminal and an output terminal, n being an integer greater than or equal to 2;
n input signal lines, each corresponding to one of the n cells and connected to the input terminal of the corresponding cell; and
n output signal lines, each corresponding to one of the n cells and connected to the output terminal of the corresponding cell,
wherein the n input signal lines and the n output signal lines extend in the first direction,
wherein each of the (n−1) input signal lines other than a first input signal line includes at least one bending region,
wherein each of the (n−1) output signal lines other than n-th output signal line includes at least one bending region,
wherein the total number of input signal lines and output signal lines which are provided over one of the n cells is (n−1), and
wherein input terminals included in the memory cell array and the n output signal lines are electrically connected to one another.

15. The semiconductor device according to claim 14, wherein the total number of intersections of a straight line connecting the input terminal and the output terminal, and the input signal lines or the output signal lines provided over each of the n cells is (n−1) in one of the n cells.

16. The semiconductor device according to claim 14, wherein the n input signal lines and the n output signal lines are provided over an insulating layer provided between the n cells, and the n input signal lines and the n output signal lines.

17. The semiconductor device according to claim 14, wherein the first direction is a row direction of the memory cell array.

18. The semiconductor device according to claim 14, wherein the first direction is a column direction of the memory cell array.

19. The semiconductor device according to claim 14, wherein each of the memory cells comprises a first transistor, a second transistor, and a capacitor.

20. The semiconductor device according to claim 19, wherein the first transistor comprises an oxide semiconductor.

* * * * *